(12) United States Patent
Chen et al.

(10) Patent No.: US 8,624,362 B2
(45) Date of Patent: Jan. 7, 2014

(54) IC WAFER HAVING ELECTROMAGNETIC SHIELDING EFFECTS AND METHOD FOR MAKING THE SAME

(75) Inventors: Yao-Hsiang Chen, Taichung (TW); Tsang-Yu Liu, Zhubei (TW); Yen-Shih Ho, Kaohsiung (TW); Shu-Ming Chang, Tucheng (TW)

(73) Assignee: Xintec, Inc., Jhongli (TW)

( * ) Notice: Subject to any disclaimer, the term of this patent is extended or adjusted under 35 U.S.C. 154(b) by 272 days.

(21) Appl. No.: 13/219,468

(22) Filed: Aug. 26, 2011

(65) Prior Publication Data
US 2012/0241923 A1 Sep. 27, 2012

(30) Foreign Application Priority Data

Mar. 22, 2011 (CN) .......................... 2011 1 0071300

(51) Int. Cl.
*H01L 21/60* (2006.01)
*H01L 23/498* (2006.01)

(52) U.S. Cl.
USPC ............ 257/659; 257/E23.114; 257/E23.068; 257/737; 257/774; 257/782; 438/613; 438/16; 438/614; 438/69

(58) Field of Classification Search
USPC ........... 257/659, E23.114, E23.068, E21.506, 257/737, 774, 782; 438/613, 16, 14, 614, 438/69
See application file for complete search history.

(56) References Cited

U.S. PATENT DOCUMENTS

| 2012/0326213 A1* | 12/2012 | Bustillo et al. | 257/253 |
| 2013/0056869 A1* | 3/2013 | Kuo et al. | 257/737 |

* cited by examiner

*Primary Examiner* — Cathy N Lam
(74) *Attorney, Agent, or Firm* — Liu & Liu

(57) ABSTRACT

An IC wafer and the method of making the IC wafer, the IC wafer includes an integrated circuit layer having a plurality of solder pads and an insulated layer arranged thereon, a plurality of through holes cut through the insulated layer corresponding to the solder pads respectively for the implantation of a package layer, and an electromagnetic shielding layer formed on the top surface of the insulated layer and electrically isolated from the solder pads of the integrated circuit layer for electromagnetic sheilding. Thus, the integrated circuit does not require any further shielding mask, simplifying the fabrication. Further, the design of the through holes facilitates further packaging process.

4 Claims, 9 Drawing Sheets

IC WAFER HAVING ELECTROMAGNETIC SHIELDING EFFECTS AND METHOD FOR MAKING THE SAME

BACKGROUND OF THE INVENTION

1. Field of the Invention

The present invention relates to IC wafer technology and more particularly, to an IC wafer having electromagnetic shielding effects. The invention relates also to method for making an IC wafer having electromagnetic shielding effects.

2. Description of the Related Art

In recent years, electronic products have been gradually focused on characteristics of high performance and small size. In consequence, the operation speed and device density of integrated circuits for electronic products must be enhanced. However, the larger operation speed and device density of an integrated circuit, the higher electromagnetic interference impact is concerned between the adjacent devices of the integrated circuit and with the surrounding electronic components of the applied electronic product.

To solve the aforesaid problem, after semiconductor wafer slicing and IC chip packaging, a metallic shielding mask may be installed, during the module fabrication of finishing an end product, to isolate integrated circuit(s) from other electronic components, protecting integrated circuit(s) against external electromagnetic fields and achieving electromagnetic shielding effects. However, the installation of such a shielding mask relatively increases the dimension of the end product and requires an extra module step, in consequence, the production cost and time of the electronic product will be relatively increased.

SUMMARY OF THE INVENTION

The present invention has been accomplished under the circumstances in view. It is the main object of the present invention to provide an IC wafer having electromagnetic shielding effects, which saves much production cost and time of the electronic product.

To achieve this and other objects of the present invention, an IC wafer defining a plurality of die zones is provided. the IC wafer comprises an integrated circuit layer having a top surface on which a plurality of solder pads which are located at the border area of each of the die zones are disposed, an insulated layer disposed on the top surface of the integrated circuit layer and opened with a plurality of through holes respectively corresponding to the solder pads, and an electromagnetic shielding layer arranged at the top surface of the insulated layer within each of the die zones and electrically isolated from the solder pads of the integrated circuit layer. Thus, the electronic product made by the integrated circuit of the IC wafer does not require any further shielding mask, simplifying the fabrication and lowering the production cost. Further, the method of making the IC wafer facilitates further packaging process.

It is another object of the present invention to provide an IC wafer fabrication method for fabricating an IC wafer having electromagnetic shielding effects, which simplifies the IC wafer manufacturing process, lowers the IC wafer manufacturing cost and facilitates a follow-up packaging process.

To achieve this and other objects of the present invention, an IC wafer fabrication method for fabricating the IC wafer defining a plurality of die zones, each of which is adapted to be embedded with an electronic device and provided with a border area adapted to be arranged with a plurality of conductive bumps electrically connected to the electronic device for being used in a further packaging process, the IC wafer fabrication method comprises the steps of: a) forming an integrated circuit layer carrying an electronic device therein and having a top surface on which a plurality of solder pads are arranged and respectively electrically connected to said electronic device; b) applying an insulated layer covering said solder pads on the top surface of said integrated circuit layer; c) forming a seed layer covering said insulated layer and said solder pads; d) forming a photoresist layer on a top surface of said seed layer and then patterning said photoresist layer to form an opening in each of said die zones, and then filling a shielding block in each said opening such that said shielding block and a part of said seed layer which is combined beneath said shielding block form an electromagnetic shielding layer; and e) removing a residual of said photoresist layer from said seed layer and making the part of said seed layer, which is combined with said shielding block, be spaced laterally from each of said solder pads.

Therefore, an IC wafer made according to the present invention omits a shielding mask installation procedure in further posterior module fabrication. Further, the conductive bumps provided for the packaging process can be implanted not only after the IC wafer fabrication as usual but also simultaneously with the electromagnetic shielding layer introduced by the IC wafer fabrication of the present invention disclosed above, thereby simplifying the follow-up packaging process.

BRIEF DESCRIPTION OF THE DRAWINGS

Other features and advantages of the present invention will be understood by reference to the following specification in conjunction with the accompanying drawings, which like reference signs denote like elements of the structure.

DETAILED DESCRIPTION OF THE INVENTION

Figure 1A:
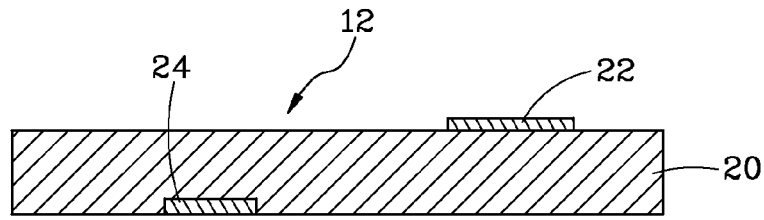
FIGS. 1A-1I illustrate an IC wafer manufacturing flow in accordance with a first embodiment of the present invention.
Figure 1B:
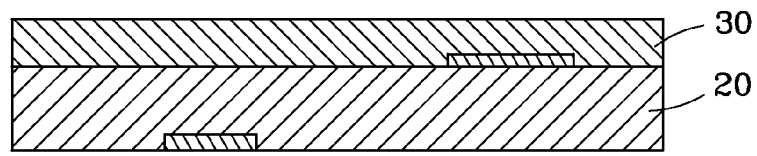
Figure 1C:
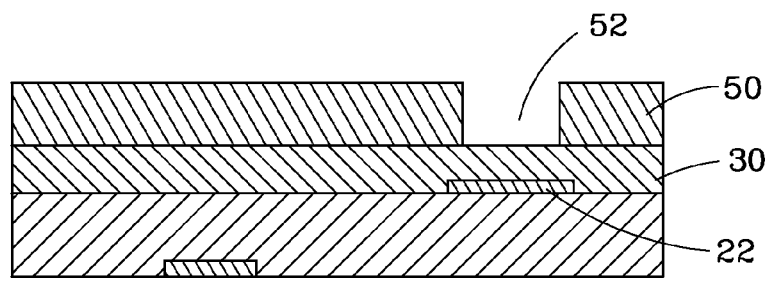
Figure 1D:
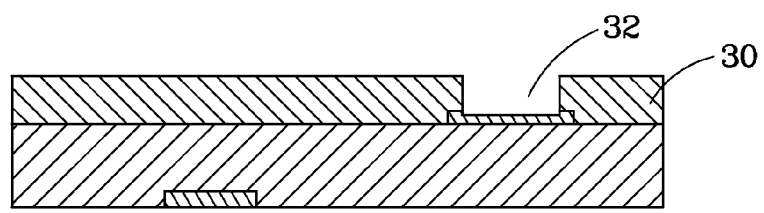
Figure 1E:
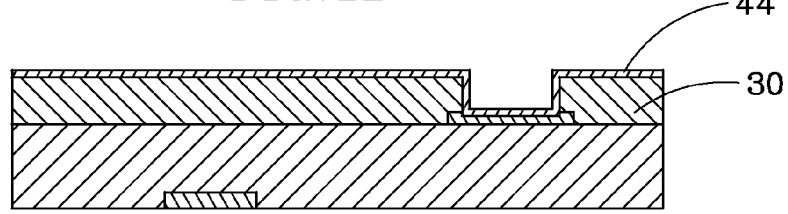
Figure 1F:
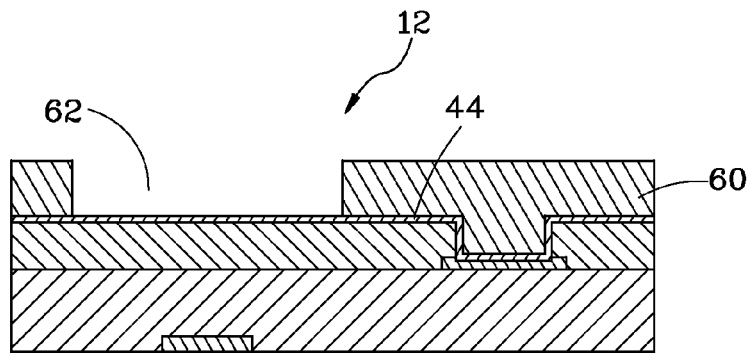
Figure 1G:
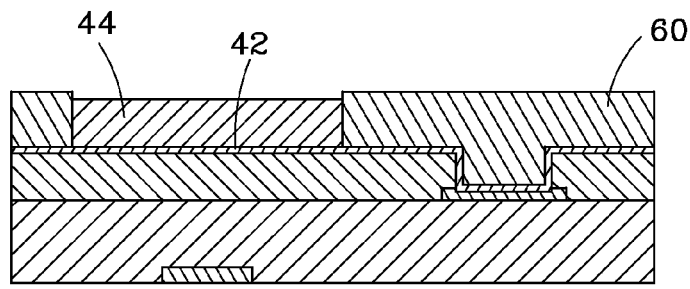
Figure 1H:
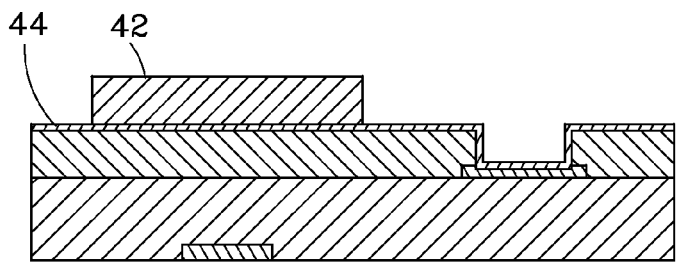
Figure 1I:
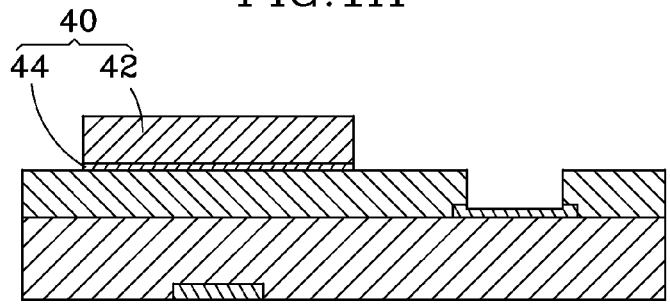
Figure 2A:
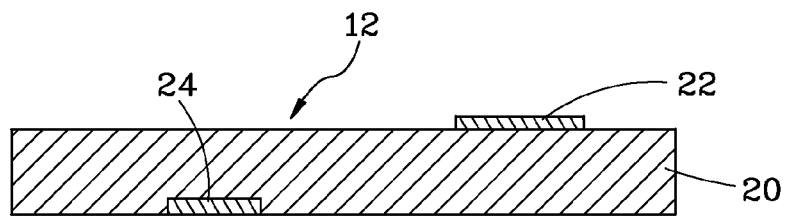
FIGS. 2A-2J illustrate an IC wafer manufacturing flow in accordance with a second embodiment of the present invention.
Figure 2B:
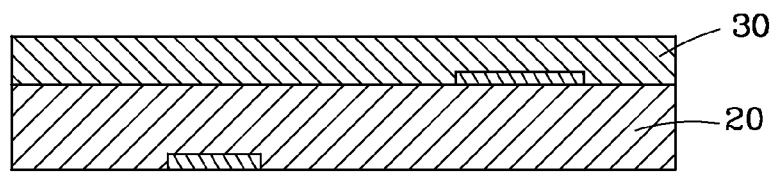
Figure 2C:
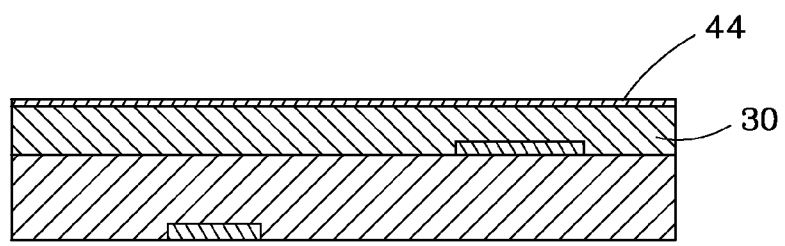
Figure 2D:
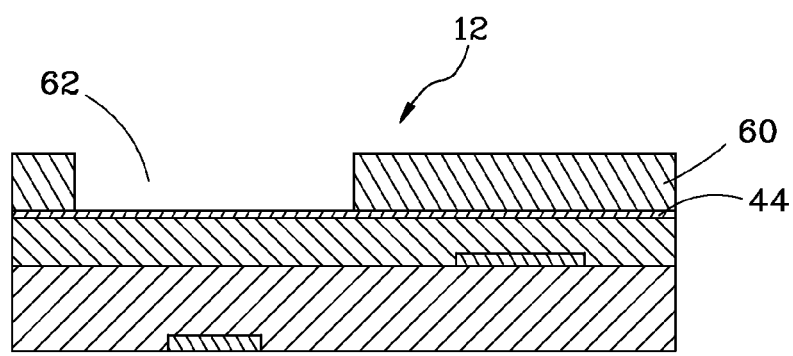
Figure 2E:
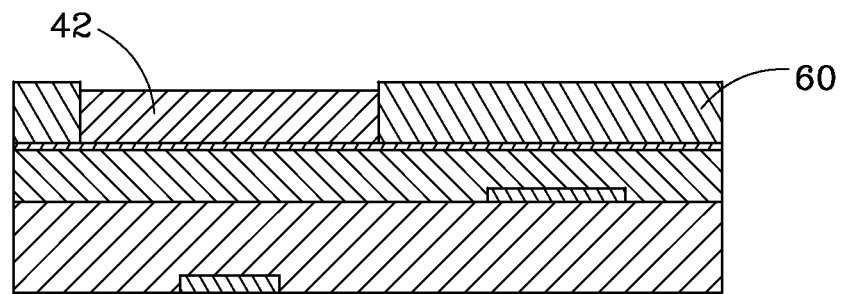
Figure 2F:
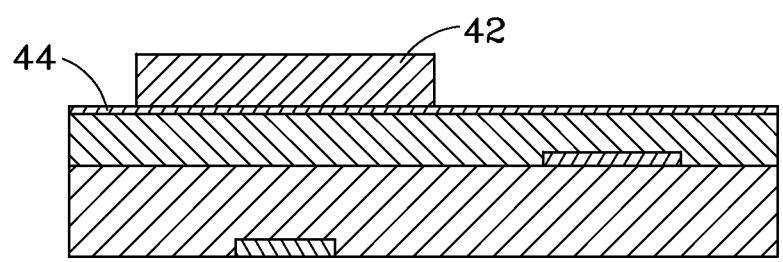
Figure 2G:
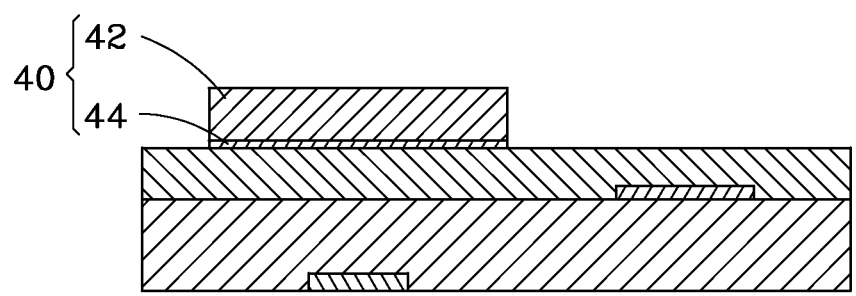
Figure 2H:
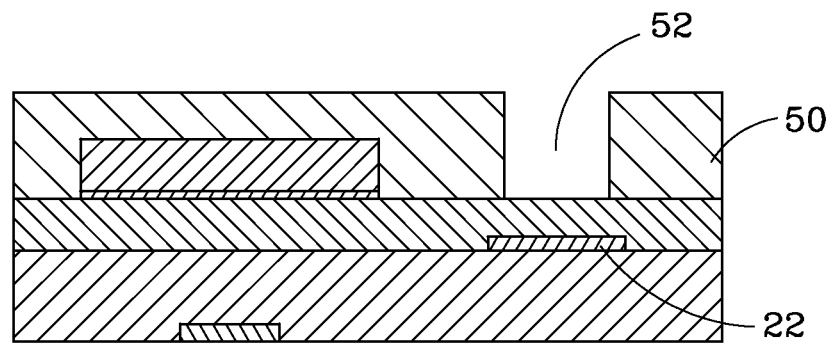
Figure 2I:
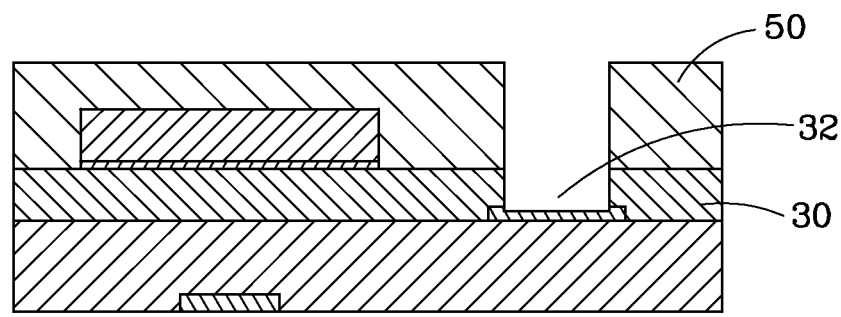
Figure 2J:
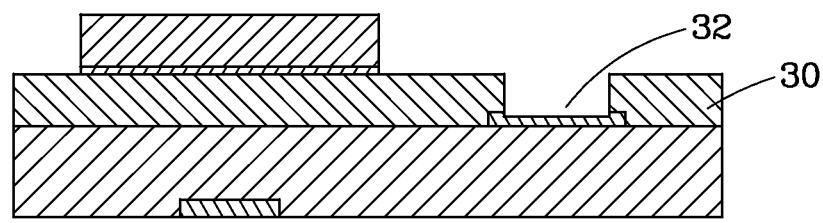
Figure 3A:
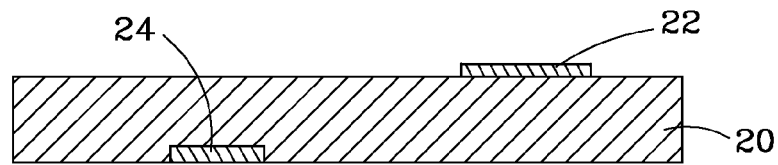
FIGS. 3A-3J illustrate an IC wafer manufacturing flow in accordance with a third embodiment of the present invention.
Figure 3B:
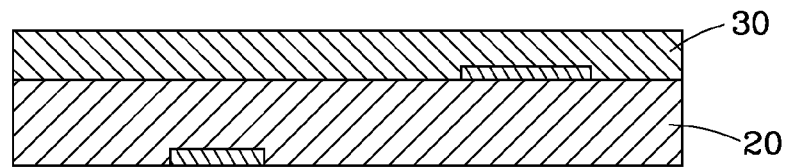
Figure 3C:
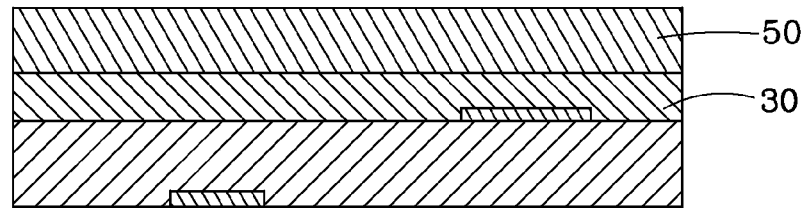
Figure 3D:
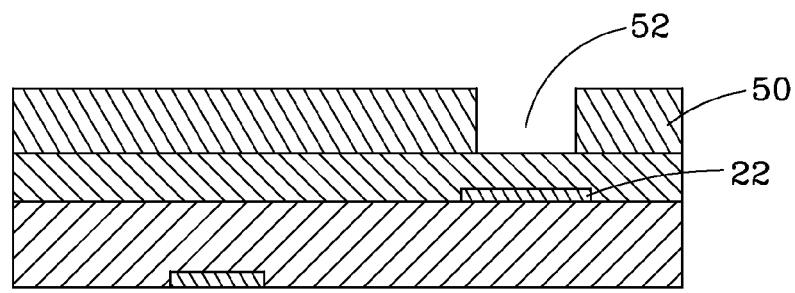
Figure 3E:
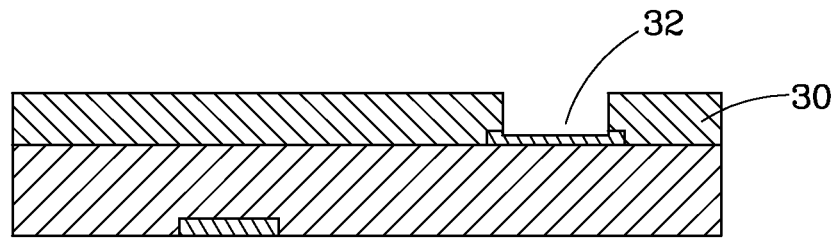
Figure 3F:
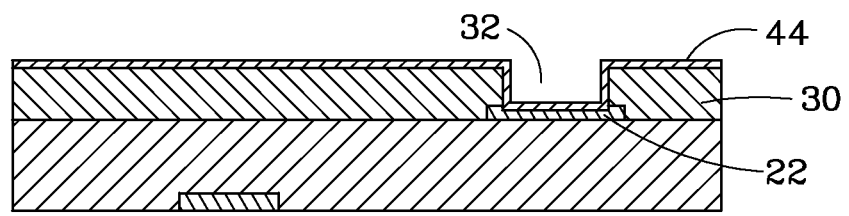
Figure 3G:
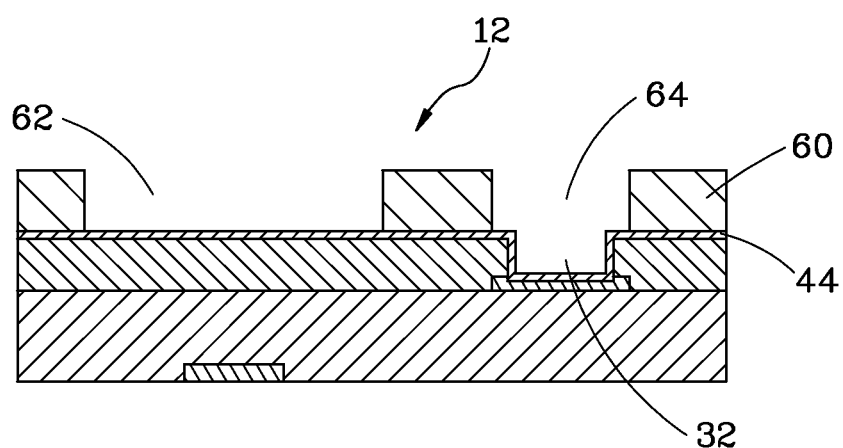
Figure 3H:
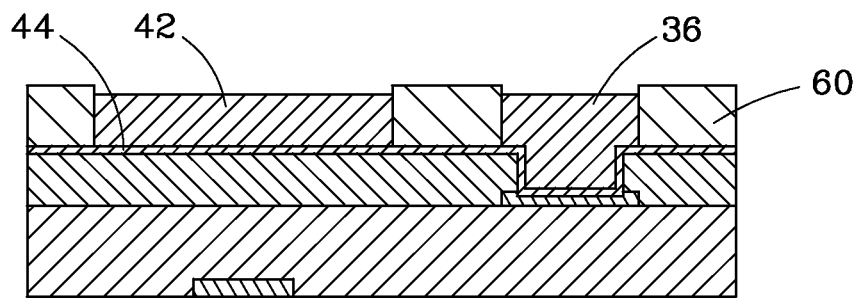
Figure 3I:
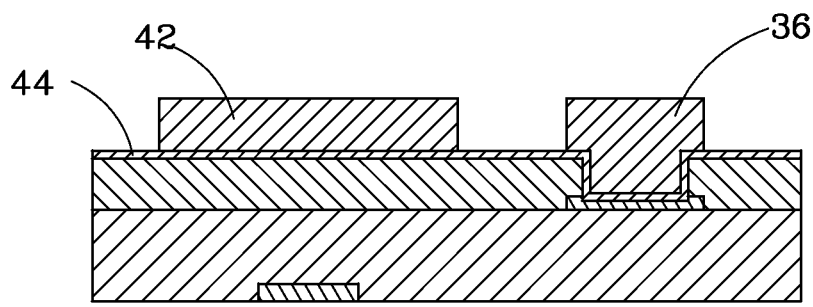
Figure 3J:
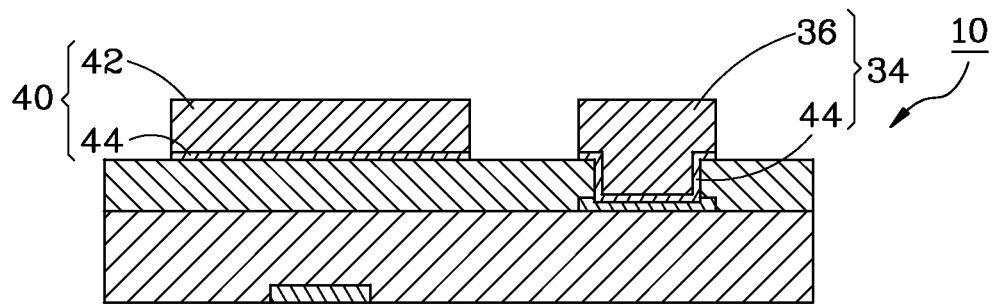
Figure 4:
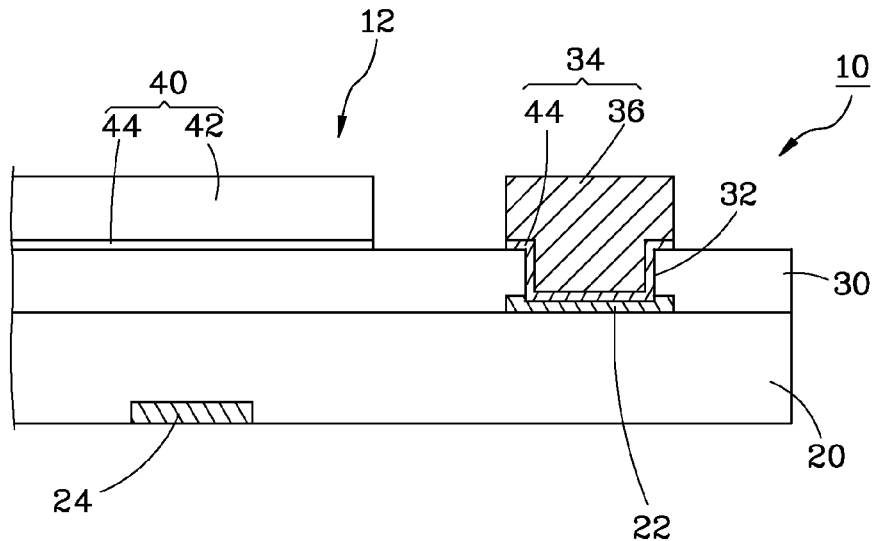
FIG. 4 is a schematic sectional structural view of an IC wafer constructed in accordance with the present invention.

Referring to FIG. 4, an IC wafer 10 in accordance with the present invention defines a plurality of die zones 12. The IC wafer 10 comprises an integrated circuit layer 20, an insulated layer 30 and an electromagnetic shielding layer 40.

The integrated circuit layer 20 comprises a plurality of solder pads 22 arranged at the top surface thereof and respectively electrically connected to an electronic device 24 embedded therein. Each solder pad 22 is located at the border area of each die zone 12.

The insulated layer 30 is located on the top surface of the integrated circuit layer 20, defining a through hole 32 corresponding to each solder pad 22 for the implantation of a package layer 34. The package layer 34 comprises a conductive bump 36 and a seed layer 44. The conductive bump 36 is mounted in the through hole 32 of the insulated layer 30 and protrudes over the top surface of the insulated layer 30. The seed layer 44 is arranged between the conductive bump 36 and both of the sidewall of the through hole 32 and the associating solder pad 22. The arrangement of the seed layer 44 enhances the bonding force between the conductive bump 36 and the associating solder pad 22, Further, distribution of the seed layer 44 along the sidewall of the through hole 32 can isolate the insulated layer 30, avoiding electric current leakage or moisture influence. However, the package layer 34 can simply provide the conductive bump 36 for positive bonding force and electrical conduction with the associating solder pad 22, achieving the same expected effects.

The electromagnetic shielding layer 40 is disposed above the electronic device 20 and spaced from each through hole 32 at a predetermined distance and electrically isolated from the solder pads 22. The electromagnetic shielding layer 40 comprises a shielding block 42 and a seed layer 44. The shielding block 42 is selected from the group consisting of a magnetic material, a conductive material and a physical synthesis of a magnetic material and a conductive material. The seed layer 44 is arranged between the insulated layer 30 and the shielding block 42.

Figure 5:
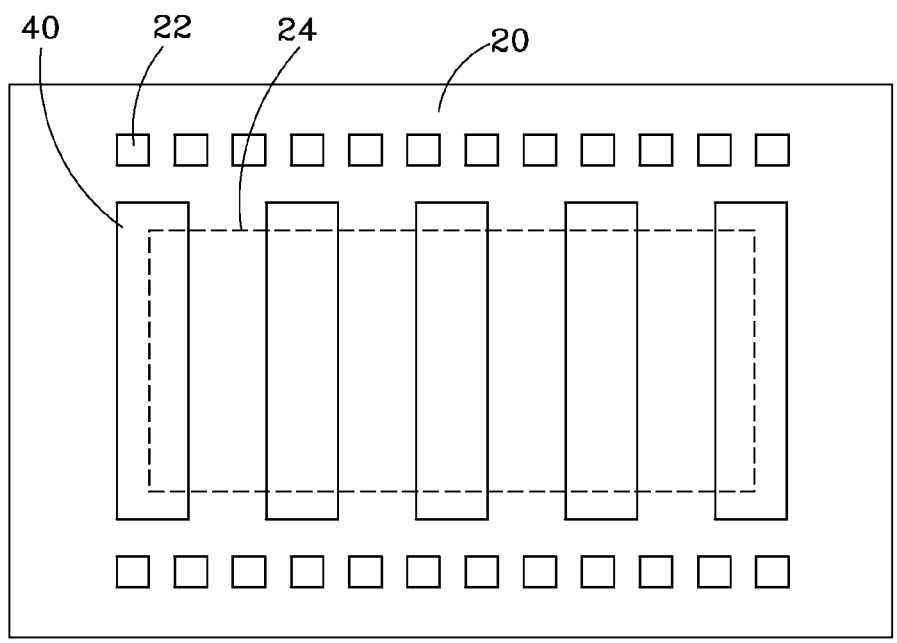
FIG. 5 is a schematic top view of the present invention, illustrating the area of arrangement of the electromagnetic material of the electromagnetic shielding layer.

In view of the aforesaid structure, it can be understood that the IC wafer 10 of the present invention has the electromagnetic shielding layer 40 be directly formed on the top surface of the insulated layer 30 during the fabrication for the purpose of electromagnetic shielding, omitting further shielding mask installation procedure as mentioned in the prior art and effectively saving production time and cost. Further, the arrangement of the electromagnetic shielding layer 40 varies with the type of the electronic device in the integrated circuit layer 20. If the electronic device 24 in the integrated circuit layer 20 is an active device or passive device exhibiting giant magnetoresistance (GMR) effect, the electromagnetic shielding layer 40 can be used as a magnet or magnetic conductor, which is the material selected from a magnetic material or the physical synthesis of a magnetic material and a conductive material. Further, for enabling the electromagnetic shielding layer 40 to effectively cover over the top side of the electronic device 24, the area of arrangement of the electromagnetic shielding layer 40 is preferably approximately equal to the area of the die zone 12. It is notable that, due to the consideration of material hardness as a magnet or magnetic conductor, a big area distribution may lead to the electromagnetic shielding layer crack during a follow-up high temperature manufacturing process subject to a temperature change. Therefore, the electromagnetic shielding layer 40 is preferably configured to provide multiple shielding blocks 42 and to have the shielding blocks 42 be arranged in a parallel manner and kept from one another, and the cover area of the shielding blocks 42 can be greater than the area of arrangement of the electronic device 24, as illustrated in FIG. 5.

After understanding of the structural details of the IC wafer 10, the fabrication of the IC wafer 10 is now explained hereinafter.

Referring to FIGS. 1A-1I, an IC wafer manufacturing process in accordance with a first embodiment of the present invention comprises the steps of:

a): forming an integrated circuit layer 20 having an electronic device 24 embedded therein and a plurality of solder pads 22 located on the top surface thereof and respectively electrically connected to the electronic device 24;

b): applying an insulated layer 30 on the top surface of the integrated circuit layer 20 over the solder pads 22, and then arranging a photoresist layer 50 over the top surface of the insulated layer 30, and then employing photolithography technique to make a first opening 52 on the photoresist layer 50 corresponding to each solder pad 22 subject to a predetermined pattern, and then etching the insulated layer 30 to make a through hole 32 corresponding to each first opening 52 for the implantation of a respective gold bump for electric connection with the associating solder pad 22 during a further conductive bump (ball grid array) or wire bonding packaging process, and then employing a photoresist stripping technique to remove the residual of the photoresist layer 50; and c): employing a metal deposition technique to form a seed layer 44 on the top surface of the insulated layer 30 and over the solder pads 22, and then applying another photoresist layer 60 on the top surface of the seed layer 44, and then employing photolithography technique to make a second opening 62 through the photoresist layer 60 in each die zone 12 adjacent to each through hole 32 and apart from the associating through hole 32 at a predetermined distance, and then employing a metal deposition technique to form a shielding block 42 in each second opening 62 in conjunction with the seed layer 44 to form an electromagnetic shielding layer 40, and then employing a photoresist stripping technique to remove the residual of the photoresist layer 60, and then employing an etching technique to remove the part of the seed layer 44 beyond each shielding block 42. After implantation of conductive bumps in the respective through hole 32 in a follow-up packaging process, the desired IC wafer 10 is thus finished.

Referring to FIGS. 2A-2J, an IC wafer manufacturing process in accordance with a second embodiment of the present invention comprises the steps of:

a): forming an integrated circuit layer 20 having an electronic device 24 embedded therein and a plurality of solder pads 22 located on the top surface thereof and respectively electrically connected to the electronic device 24;

b): applying an insulated layer 30 on the top surface of the integrated circuit layer 20 over the solder pads 22;

c): employing a metal deposition technique to form a seed layer 44 on the top surface of the insulated layer 30, and then arranging a photoresist layer 60 on the top surface of the insulated layer 30, and then employing photolithography technique to each die zone 12 to form a second opening 62 on the top surface of the seed layer 44, and then employing a metal deposition technique and using a material selected from the group of a magnetic material, a conductive material and a physical synthesis of a magnetic material and a conductive material to form a shielding block 42 in the second opening 62 in conjunction with the seed layer 44 in forming an electromagnetic shielding layer 40, and then employing a photoresist stripping technique to remove the residual of the photoresist layer 60, and then employing an etching technique to remove the part of the seed layer 44 beyond the shielding block 42; and d): applying a photoresist layer 50 on the top surface of the insulated layer 30 over the electromagnetic shielding layer 40, and then employing photolithography technique to made a first opening 52 corresponding to each solder pad 22, and then etching the insulated layer 30 to make a through hole 32 corresponding to each first opening 52 for the implantation of a respective gold bump for electric connection with the associating solder pad 22 during a further conducting bum (ball grid array) or wire bonding packaging process, and then employing a photoresist stripping technique to remove the residual of the photoresist layer 50. After implantation of conductive bumps in the respective through holes 32 in a follow-up packaging process, the desired IC wafer 10 is thus finished.

Referring to FIGS. 3A-3J, an IC wafer manufacturing process in accordance with a third embodiment of the present invention comprises the steps of:

a): forming an integrated circuit layer 20 having an electronic device 24 embedded therein and a plurality of solder pads 22 located on the top surface thereof and respectively electrically connected to the electronic device 24;

b): coating an insulated layer 30 on the top surface of the integrated circuit layer 20 over the solder pads 22, and then coating a photoresist layer 50 on the top surface of the insulated layer 30, and then employing photolithography technique to make a first opening 52 on the photoresist layer 50 corresponding to each solder pad 22, and then etching the insulated layer 30 to make a through hole 32 corresponding to each first opening 52, and then employing a photoresist stripping technique to remove the residual of the photoresist layer 50;

c): employing a metal deposition technique to form a seed layer 44 on the top surface of the insulated layer 30 and the sidewall of each through hole 32 and the top surface of each solder pad 22, and then coating a photoresist layer 60 on the top surface of the seed layer 44, and then employing photolithography technique to make a plurality of second openings 62 and a third opening 64 on the photoresist layer 60 in each die zone 12 and to have the third opening 64 be respectively aligned with the through holes 32, and then employing a metal deposition technique to synchronously implant a shielding block 42, which stacks with a part of the seed layer 44 to form an electromagnetic shielding layer 40, and a conductive bump 36, which stacks with a part of the seed layer 44 to form an package layer 34, in each second opening 62 and third opening 64 respectively, and then employing a photoresist stripping technique to remove the residual of the photoresist layer 60, and then employing an etching technique to remove the part of the seed layer 44 beyond the shielding block 42 and the conductive bumps 36, wherein the shielding block 42 is selected from the group consisting of a conductive material, a magnetic material and a physical synthesis of a magnetic material and a conductive material. The desired IC wafer 10 is thus finished.

In view of the aforesaid manufacturing process, an IC wafer 10 made according to the present invention omits a shielding mask installation procedure in further posterior module fabrication. Further, through holes 32 are provided during the manufacturing process for the implantation of a package layer 34, enabling conductive bumps to be implanted, after implantation of the shielding block 42 or simultaneously with the shielding block 42, into the through holes 32 during a further conductive bump (ball grid array) or wire bonding packaging process, thereby simplifying the follow-up packaging process.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An IC wafer fabrication method for fabricating the IC wafer defining a plurality of die zones, each of which is adapted to be embedded with an electronic device and provided with a border area adapted to be arranged with a plurality of conductive bumps electrically connected to the electronic device for being used in a further packaging process, the IC wafer fabrication method comprising the steps of:

a) forming an integrated circuit layer carrying said electronic device therein and having a top surface on which a plurality of solder pads are arranged and respectively electrically connected to said electronic device;

b) applying an insulated layer covering said solder pads on the top surface of said integrated circuit layer;

c) forming a seed layer covering said insulated layer and said solder pads;

d) forming a photoresist layer on a top surface of said seed layer, and then patterning said photoresist layer to form an opening in each of said die zones, and then filling a shielding block in each said opening such that said shielding block and a part of said seed layer which is combined beneath said shielding block form an electromagnetic shielding layer; and e) removing a residual of said photoresist layer from said seed layer and making the part of said seed layer, which is combined with said shielding block, be spaced laterally from each of said solder pads.

2. The IC wafer fabrication method as claimed in claim 1, wherein after formation of said insulated layer in step b) a plurality of through holes corresponding to said solder pads are formed by etching said insulated layer; said through holes are covered by said seed layer in step c).

3. The IC wafer fabrication method as claimed in claim 2 wherein the step d) of patterning said photoresist layer two openings are formed in each of said die zones for said shielding block and said conductive bump are synchronously filled in said two openings respectively; wherein after removing said photoresist layer of step e) a part of said seed layer outside said two openings are removed.

4. The IC wafer fabrication method as claimed in claim 1, wherein after removal of said photoresist layer in step e) a part of said seed layer beyond said shielding block is removed, and then a plurality of through holes corresponding to said solder pads are formed by etching said insulated layer, and then said conductive bumps are implanted into said through holes respectively.

\* \* \* \* \*